(12) United States Patent
Song

(10) Patent No.: US 10,345,856 B2
(45) Date of Patent: Jul. 9, 2019

(54) FOLDABLE DISPLAY DEVICE

(71) Applicant: LG DISPLAY CO., LTD., Seoul (KR)

(72) Inventor: Na-Young Song, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/828,129

(22) Filed: Nov. 30, 2017

(65) Prior Publication Data

US 2018/0150108 A1 May 31, 2018

(30) Foreign Application Priority Data

Nov. 30, 2016 (KR) .................. 10-2016-0162340

(51) Int. Cl.
| | | |
|---|---|---|
| G06F 1/16 | (2006.01) | |
| G09G 3/34 | (2006.01) | |
| H05K 1/02 | (2006.01) | |
| H05K 5/00 | (2006.01) | |
| H05K 5/02 | (2006.01) | |
| H01L 51/00 | (2006.01) | |
| H01L 27/32 | (2006.01) | |
| G09F 9/30 | (2006.01) | |

(52) U.S. Cl.
CPC .......... *G06F 1/1641* (2013.01); *G06F 1/1616* (2013.01); *G06F 1/1652* (2013.01); *G06F 1/1677* (2013.01); *G09G 3/34* (2013.01); *H01L 27/323* (2013.01); *H01L 51/0097* (2013.01); *H05K 1/028* (2013.01); *H05K 5/0017* (2013.01); *H05K 5/0247* (2013.01); *G09F 9/301* (2013.01); *H01L 2251/5338* (2013.01); *H01L 2251/558* (2013.01)

(58) Field of Classification Search
CPC .... G06F 1/1652; G06F 1/1681; G06F 1/1616; G06F 1/1641; G06F 1/1677; H01L 2251/5338; H01L 2251/558; H04M 1/0268; G09F 9/301; H05K 5/0017; H05K 5/0226; H05K 1/028; H05K 5/0247; G09G 3/34

See application file for complete search history.

(56) References Cited

U.S. PATENT DOCUMENTS

| | | | | |
|---|---|---|---|---|
| 9,811,119 B2 * | 11/2017 | Seo | .................. | G06F 1/1652 |
| 9,983,424 B2 * | 5/2018 | Kim | .................. | G02F 1/133305 |
| 10,020,462 B1 * | 7/2018 | Ai | .................. | H01L 51/524 |
| 2015/0043174 A1 * | 2/2015 | Han | .................. | G02F 1/13452 |
| | | | | 361/749 |

* cited by examiner

*Primary Examiner* — James Wu
(74) *Attorney, Agent, or Firm* — Birch, Stewart, Kolasch & Birch, LLP

(57) ABSTRACT

A foldable display device can include a display panel including a first non-folding part, a second non-folding part and a folding part disposed between the first and second non-folding parts; a support disposed on a rear surface of the display panel; and a back cover disposed on a rear surface of the support, in which the back cover includes open patterns exposing the support, and folding patterns disposed on an area of the rear surface of the support corresponding to the folding part, the support includes protruding patterns disposed on an area of the support corresponding to the open patterns of the back cover, and the protruding patterns are fitted into the open patterns.

20 Claims, 5 Drawing Sheets

FOLDABLE DISPLAY DEVICE

This application claims the benefit of Korean Patent Application No. 10-2016-0162340, filed on Nov. 30, 2016, which is hereby incorporated by reference as if fully set forth herein.

BACKGROUND OF THE INVENTION

Field of the Invention

The present invention relates to a foldable display device, and more particularly, to a foldable display device capable of preventing distortion of a folding part of a display screen due to deformation of the folding part.

Discussion of the Related Art

An image display device, which realizes various pieces of information on a screen, is a core technology of the information and communication age, and is being developed in the direction of becoming thinner, lighter, more portable, and having higher performance. In response, a flat panel display device, which is thinner and lighter than a cathode ray tube (CRT), for example, an organic light-emitting display device, which controls the amount of light emitted from an organic light-emitting layer to display an image, is in the spotlight.

In an organic light-emitting display device, a plurality of pixels is arranged in a matrix form to display an image. Here, each pixel includes a light-emitting element, and a pixel drive circuit including, for example, a plurality of transistors to independently drive the light-emitting element.

Since such an organic light-emitting display device employs a self-luminous organic light-emitting element, the need for an additional light source is eliminated. In addition, since the organic light-emitting display device can be embodied as an ultrathin display device, research into an in-cell touch-type foldable display device, which employs organic light-emitting elements and includes a touch electrode array in a light-emitting cell, has been actively conducted in recent years.

The foldable display device is designed to be folded in conjunction with a display panel contained therein. In order to protect the display panel having the flexible property, the foldable display device is provided with a back cover. Accordingly, the back cover, which is disposed on the rear surface of the display panel to protect the display panel, should also be designed to be foldable.

A back cover of a related-art foldable display device includes a region corresponding to a folding part, which is made of silicon resin or the like to have a flexible structure, and a region corresponding to a non-folding part, which is made of metal, rigid plastic or the like to protect the display panel.

In the related-art foldable display device adopting the back cover, the folding part and the non-folding part are usually made of different materials. Here, because the two materials have different physical properties, such as rigidity, elasticity, flexibility and the like, and are compressed to different extents while passing through processes, there is a high possibility that unevenness is generated at the boundary surface between the two different materials. The unevenness generated between the folding part and the non-folding part causes a phenomenon whereby a display screen is transferred or distorted. Furthermore, the related-art foldable display device adopting a back cover has other problems in that the flexible folding part is curled upward or droops due to concentration of stress after being folded a number of times, and is deformed in its appearance or cured under the condition of high temperature and humidity.

SUMMARY OF THE INVENTION

Therefore, the present invention has been made in view of the above problems, and it is an object of the present invention to provide a foldable display device, which is able to reduce a phenomenon of transfer and distortion of a folding part and to prevent a display panel from drooping, and which has an excellent folding property.

To achieve the above object, a foldable display device according to the present invention includes a display panel including a folding part and non-folding parts, a support disposed on a rear surface of the display panel, and a back cover disposed on a rear surface of the support, in which the back cover includes open patterns exposing the support and folding patterns provided on an area of the rear surface of the support that corresponds to the folding part, and in which the support includes protruding patterns, which are provided on an area of the support corresponding to the open patterns of the back cover and fit into the open patterns.

It is to be understood that both the foregoing general description and the following detailed description of the present invention are explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 1:
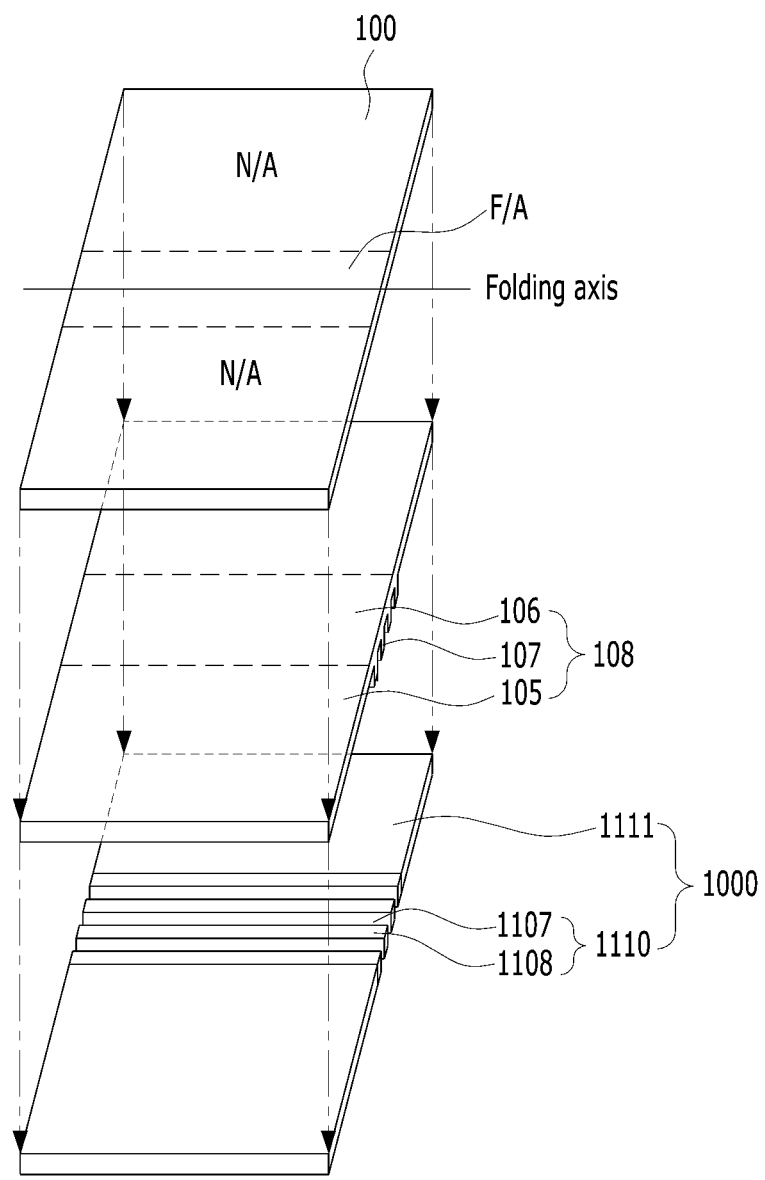
FIG. 1 is an exploded perspective view illustrating a foldable display device according to the present invention.

Hereinafter, exemplary embodiments of the present invention will be described with reference to the accompanying drawings. In the entire specification, the same or similar elements are denoted by the same reference numerals even though they are depicted in different drawings. In the following description of the present invention, a detailed description of known functions and configurations incorporated herein will be omitted when it may make the subject matter of the present invention rather unclear. Also, the terms used in the following description are terms defined taking into consideration the functions obtained in accordance with the present invention, and may differ from the names of parts of actual products.

When an element or layer is referred to as being "on" another element or layer, it means not only the situation where the element or layer is directly on the another element or layer but also the situation where a further element or layer is interposed therebetween. In addition, when an element or layer is referred to as being in contact with another element or layer, it means the situation where there is no intervening element or layer therebetween.

Sizes and thicknesses of parts shown in the drawings are illustrated for convenience of explanation, and the present invention is not necessarily limited to the sizes and thicknesses shown in the drawings.

FIG. 1 is an exploded perspective view of a foldable display device according to the present invention.

The foldable display device according to the present invention includes a panel 100 having at least one folding part F/A capable of being folded and non-folding parts N/A occupying the remaining area of the panel 100 excluding the folding part, a support 108 disposed on the rear surface of the display panel and including a soft part 106 at an area thereof corresponding to the folding part F/A, and a back cover 1000 disposed on the rear surface of the support 108 and including at least one open pattern 1107 at an area thereof corresponding to the folding part F/A to expose the display panel. The support 108 includes protruding patterns 107, which extend downward from the areas of the soft part 106 that correspond to the open patterns 1107 in the back cover 1000, and which are inserted into the open patterns 1107. The display panel 100 and the support 108 can be attached to each other via an adhesive layer. The folding part F/A of the display panel 100 may be folded about the folding axis. Although the folding axis is illustrated as being oriented in the horizontal direction in FIG. 1, the present invention is not necessarily limited thereto.

The display panel 100 will be described in more detail with reference to FIG. 2. The display panel 100 according to the embodiment of the present invention can include a first substrate 120, a first buffer layer 130 disposed on the first substrate 120, a thin-film transistor array 140 defining pixels on the first buffer layer 130 in a matrix fashion in which each of the pixels has a thin-film transistor, an organic light-emitting array 150 connected to the respective thin-film transistors of the pixels, a protective layer 160 covering the thin-film transistor array 140 and the organic light-emitting array 150, excluding a pad part, a touch electrode array 230 attached to the protective layer 160 with a second adhesive layer 400 disposed therebetween, a second buffer layer 220 and a second substrate 210, which are formed on the touch electrode array 230 in that order.

The display panel 100 according to the present invention is not necessarily limited to the above embodiment, and various foldable display devices including the thin-film transistor array 140 and the organic light-emitting array 150 may be applied.

An active area A/A and a dead area D/A are defined in each of the first buffer layer 130 and the second buffer layer 220, and thin-film transistors contained in the thin-film transistor array 140 excluding the touch electrode array 230, the organic light-emitting array 150 and the pad part are formed in the active area A/A. A touch pad part and a pad part of the thin-film transistor array are defined in a part of the dead area D/A.

Here, the first substrate 120 and the second substrate 210 serve to prevent damage to the internal array during a laser radiation or etching process. In some situations, the first substrate 120 and the second substrate 210 serve to protect the display device from the outside. The first substrate 120 and the second substrate 210 can be made of a polymer material such as polyimide and photoacryl, without being limited thereto.

Each of the first buffer layer 130 and the second buffer layer 220 is made in a manner of successively layering the same kind of inorganic film such as oxide film ($SiO_2$) or nitride film (SiNx), or alternately layering different kinds of inorganic film, such as oxide film ($SiO_2$) and nitride film (SiNx). The first buffer layer 130 and the second buffer layer 220 serve as barriers for preventing moisture or external air from infiltrating the organic light-emitting array 150 during a subsequent process of attaching an upper board to a lower board.

The touch electrode array 230 and a touch pad 2350 are formed on the same surface of the second buffer layer 220. The touch pad 2350 is coupled to the pad of the thin-film transistor array 140 via a seal 450 containing a conductive ball 455 through a process of attaching the upper element to the lower element using the adhesive layer 400. The adhesive layer 400 functions to prevent the infiltration of moisture, and also functions to reliably prevent external air and moisture from infiltrating the organic light-emitting array 150 in cooperation with the protective layer 160.

The thin-film transistor array 140 including the pad is configured to project further at a side thereof than the touch electrode array 230. The projected portion can be provided with a driving circuit for driving the touch electrode array, the thin-film transistor array and the organic light-emitting array together, without being limited thereto. Also, the thin-film transistor driving pad and a dummy pad include a plurality of dummy electrodes, and are connected to the driving circuit through wiring. The driving circuit may be connected to a flexible printed circuit board (FPCB) through bonding, and may be controlled by a micro control unit (MCU) and a timing controller, which are included in the FPCB. The dummy pad is formed on the same layer as the metal constituting a gate line or data line in the region of the dead area outside the active area, which corresponds to the touch pad. The driving circuit can be mounted on the FPCB or an anisotropic conductive film (ACF), and can then be provided on the rear surface of the display panel 100.

The driving circuit may be mounted on the FPCB or the ACF in a chip on film (COF) manner.

Figure 2:
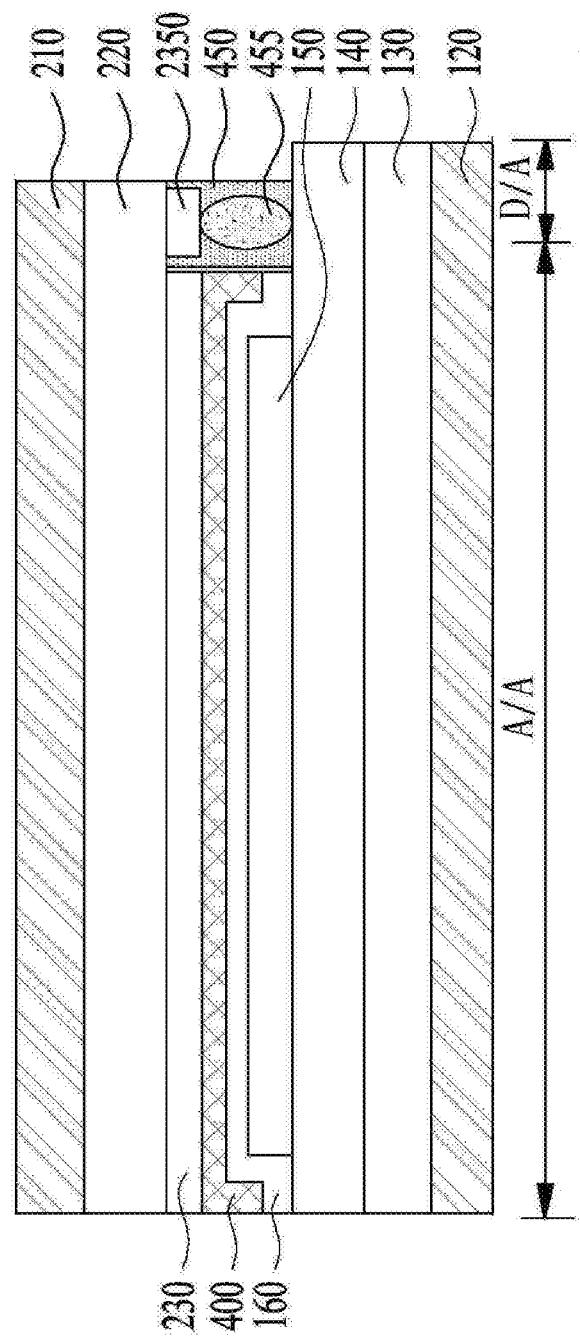
FIG. 2 is a cross-sectional view illustrating a display panel according to the present invention.

In this disclosure, the constituent elements shown in FIG. 2 are collectively referred to as the display panel 100 for convenience of explanation. As mentioned above, the display panel 100 is not necessarily limited to the construction shown in FIG. 2, and various display devices including the thin-film transistor array 140 and the organic light-emitting array 150 may be applied.

As mentioned above, the support 108 is attached to the rear surface of the display panel 100 via the adhesive layer. The support 108 includes a soft part 106, which is disposed on the rear surface of the folding part F/A and is flexible, and at least one protruding pattern 107, which protrudes from the soft part in the rearward direction of the support 108. The soft part can be provided on the entirety of the support 108, that is, the entire rear surface of the display panel 100. While the soft part 106 has flexibility and low rigidity, the support 108 can be provided on the rear surface thereof with the back cover 1000 having high rigidity to compensate for the low rigidity of the support 108. In the situation where the support 108 is made of different materials, a stepped portion can be generated at the interface between the different materials when the back cover 1000 is attached to the support 108. Accordingly, when the entire support 108 is constituted only of the soft part 106, this is advantageous in improving the flatness of the back cover 1000.

The non-folding part N/A of the display panel 100 can also be provided on the rear surface thereof with a hard part 105, in place of the soft part 106. Although the hard part 105 can additionally support the display panel 100 by virtue of its high rigidity, it is preferable that the hard part 105 also be made of the same material as the material of the soft part 106 to prevent the generation of a stepped portion at the interface between the hard part 105 and the soft part 106. Furthermore, in order to improve the flatness of the display panel 100, it is preferable that the hard part 105 be formed at the same level as the soft part 106.

The soft part 106 can be attached to the display panel 100 via the adhesive layer, and the soft part 106 and the protruding patterns 107 can be simultaneously formed of the same material. Although the protruding patterns 107 are illustrated as being exaggerated in size for convenience of explanation, the protruding patterns 107 can actually have a fine size or height of 0.01-1 mm.

The protruding patterns 107 protrude toward the back cover 1000.

The protruding patterns 107 have the same shapes as the shapes of the open patterns 1107 in the back cover 1000, and are formed to be fitted into the open patterns 1107. Specifically, when the open patterns 1107 in the back cover 1000 are formed into predetermined shapes by removing part of the material of the back cover folding part 1110 of the back cover 1000, the protruding patterns have the same shapes as the open patterns. The protruding patterns 107 project toward the back cover 1000 to be fitted into the removed portions of the back cover 1000.

The protruding patterns 107 are preferably disposed on the rear surface of the folding part F/A of the display panel 100 such that the display panel 100 becomes foldable. Accordingly, the protruding patterns 107 can be flexible, similar to the soft part 106, and can be integrally formed with the soft part 106, without being limited thereto.

As mentioned above, although the protruding patterns 107 may be formed of polymer material such as silicon resin, the present invention is not necessarily limited thereto.

The back cover 1000 is formed of a material having high rigidity, such as metal. As mentioned above, the rear surface of the folding part F/A of the back cover 1000 is provided with at least one open pattern 1107. The back cover 1000 will be described in more detail with reference to FIG. 1. The back cover 1000 includes a plate 1111 disposed on the rear surface of the non-folding part N/A of the display panel 100, the open patterns 1107 disposed on the rear surface of the folding part F/A of the display panel 100, and folding patterns 1108, which are formed in the remaining area of the back cover folding part 1110, excluding the open patterns 1107, which is disposed on the rear surface of the folding part F/A of the display panel 100, by removing the portion of the material of the back cover 1000 corresponding to the open patterns 1107.

The plate 1111 and the folding patterns 1108 can be formed of the same material. In particular, the plate 1111 and the folding patterns 1108 can be simultaneously formed in such a manner as to execute patterning of a single metal plate to form the open patterns 1107.

As mentioned above, the open patterns 1107 in the back cover 1000 are incised patterns, which are formed by patterning a portion of a metal plate, and the protruding patterns 107 of the support 108 are raised patterns, which have the same shape as the shapes of the open patterns 1107. Accordingly, when the back cover 1000 is attached to the support 108, the open patterns 1107 engage with the protruding patterns 107 without a height difference therebetween. Preferably, the protruding patterns 107 have the same thickness as the thickness of the back cover 1000 such that there is no height difference in the engaging area between the two patterns after the open patterns 1107 engage with the protruding patterns 107.

The open patterns 1107 serve to assist in folding of the back cover 1000, which is made of a material having a high rigidity, such as metal. Since metal is not present in the area of the back cover 1000 in which the open patterns 1107 are formed, free folding is allowed in the area in which the open patterns 1107 are formed. Although the open patterns are illustrated as being exaggerated in size for convenience of explanation in FIG. 1, each of the open patterns 1107 also has a fine size of 0.03-1 mm. The back cover 1000, which is provided with a large number of fine open patterns 1107 having no metal, has improved foldability.

The area of the back cover 1000 that corresponds to the folding part F/A of the display panel 100, is provided with the open patterns 1107. With the formation of the open patterns 1107, the remaining area of the back cover 1000 excluding the open patterns 1107 is also provided with predetermined patterns. The patterns of the back cover 1000, which are formed by the removal of the open patterns 1107, are just the folding patterns 1108.

Although FIG. 1 shows an embodiment in which the folding patterns 1108 include a plurality of folding patterns, each of which has the shaped of a metal bar parallel to the folding axis, the folding patterns 1108 can be formed into various shapes depending on the design.

Figure 3:
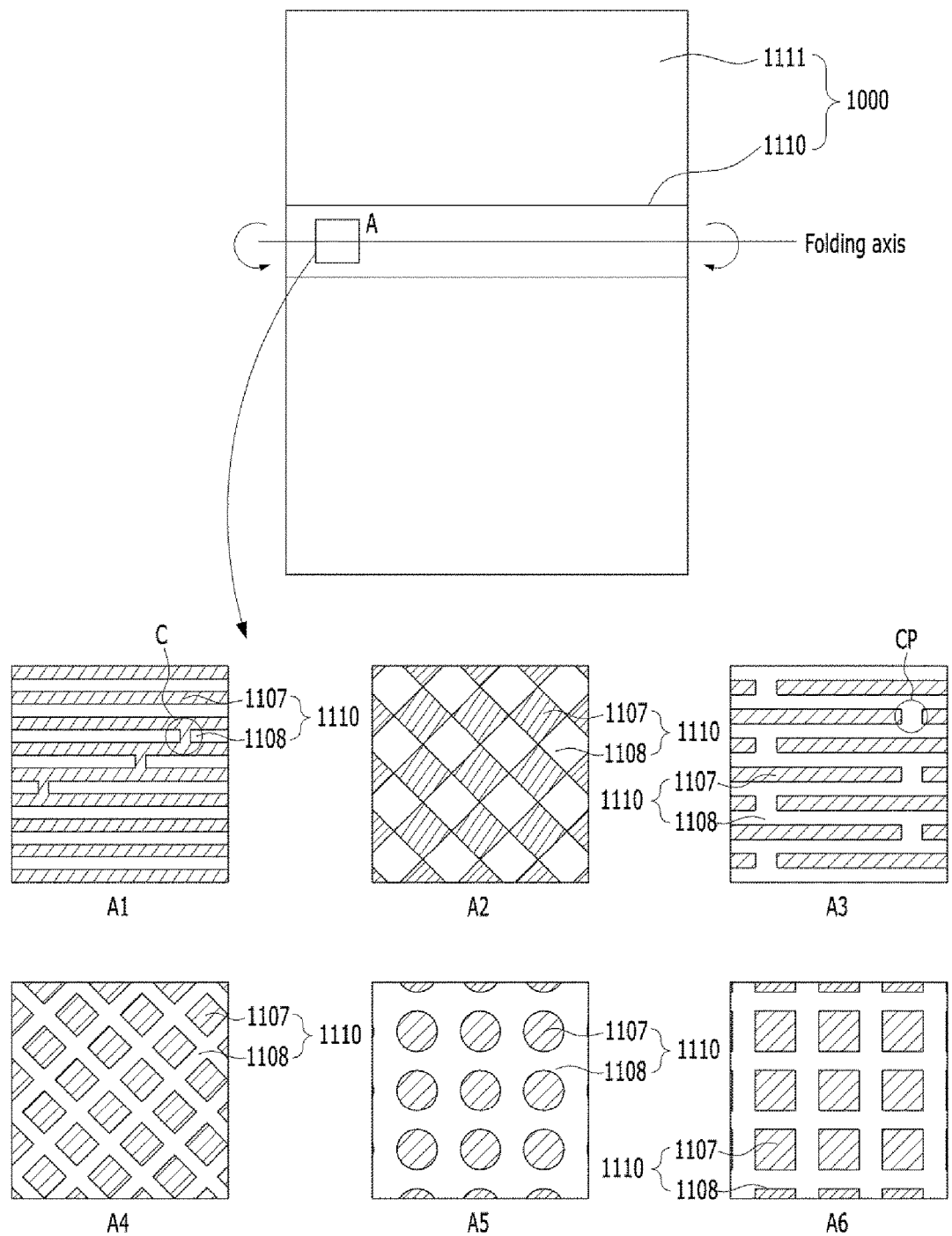
FIG. 3 is a rear view of a back cover, which shows some of the various shapes of the folding patterns and open patterns.

FIG. 3 shows the rear surface of the back cover 1000, which illustrates some of the various shapes of the folding patterns 1108 and the open patterns 1107. The open patterns 1107 are coupled to protruding patterns 107 by engagement therebetween.

As mentioned above, the back cover 1000 includes the plate 1111 and the back cover folding part 1110. The plate 1111 is made of a metal having high rigidity to support the non-folding parts N/A. Since the back cover folding part 1110 may be folded about the folding axis, the back cover folding part 1110 may be folded at the time of folding of the display panel 100.

A1 to A6 of FIG. 3, which are enlarged views of portion A of FIG. 3, show various examples of shapes that the folding patterns 1108 and the open patterns 1107 can have. However, the shapes of the folding patterns 1108 and the open patterns 1107 are not limited to the above embodiments, and may be variously modified depending on the design.

Referring to A1 of FIG. 3, the folding patterns 1108 can be constituted by a plurality of metal bars, which are oriented to be parallel to the folding axis. Each of the metal bars can have the same length as the width of the display panel 100. Since the folding patterns 1108 are constituted by the metal bars, the open patterns 1107 can also be oriented to be parallel to the folding axis.

Although each of the metal bars can have the same length as the width of the display panel 100, the metal bars may not fully extend from one side to the opposite side of the display panel 100 and can have an interruption point. In other words, each of the open patterns 1107, which is linearly disposed to be parallel to the folding axis, can have a connecting open pattern C to be connected to the adjacent open pattern via the connecting open pattern C. Consequently, the metal bar-shaped folding pattern 1108 may be interrupted at the point at which the connecting open pattern is located.

Referring to A3 of FIG. 3, one of the metal bar-shaped folding patterns 1108 can be connected to the adjacent folding pattern 1108 via a connecting pattern CP, and the corresponding open pattern 1107 may thus be interrupted at the connecting pattern CP. In this situation, the folding pattern 1108 can have the connecting open pattern C, and both the linear folding pattern 1108 and the linear open pattern 1107 may thus be interrupted.

Referring to A2 of FIG. 3, each of the open patterns 1107 can be formed to have a diamond shape. Since the open patterns 1107 have the diamond shape, the folding patterns 1108 can be disposed between the open patterns 1107 having a diamond shape. As shown in A2 of FIG. 3, the folding patterns 1108 can be formed into, for example, diamond shapes, which are connected to each other in the horizontal and vertical directions. When the open patterns 1107 are formed into diamond shapes, which are densely arranged, the folding patterns 1108 can form a net shape overall.

In addition, the open patterns 1107 can each have a circular or elliptic shape, as shown in A5 of FIG. 3, or can each have a square shape, as shown in A6 of FIG. 3.

The above-mentioned shapes of open patterns 1107 and the folding patterns 1108 are only some of various shapes that the open patterns 1107 and the folding patterns 1108 can have. The open patterns 1107 and the folding patterns 1108 may have various shapes. In this embodiment, for convenience of explanation, the coupling structure of the foldable display device according to the present invention will be described on the basis of the back cover 1000, which includes the bar-shaped folding patterns 1108, which are spaced apart from each other, and the linear open patterns 1107 defined between the folding patterns 1108, as shown in A1 of FIG. 3. However, the folding patterns 1108 and the open patterns 1107 are not limited to the above-described structure.

Although each of the folding patterns 1108 is illustrated as having a large size for convenience of explanation in FIG. 3, it should be noted that each of the folding patterns 1108 can actually have a fine size. Each of the folding patterns 1108 can be formed to have a fine size. When each of the folding patterns 1108 has, for example, a bar shape as shown in A1 of FIG. 3, the bar-shaped folding pattern 1107 can be formed to have a diameter or a width of about 0.03-0.1 mm, and the open pattern 1107 can be formed to have a diameter or a width of about 0.1-0.4 mm.

Figure 4:
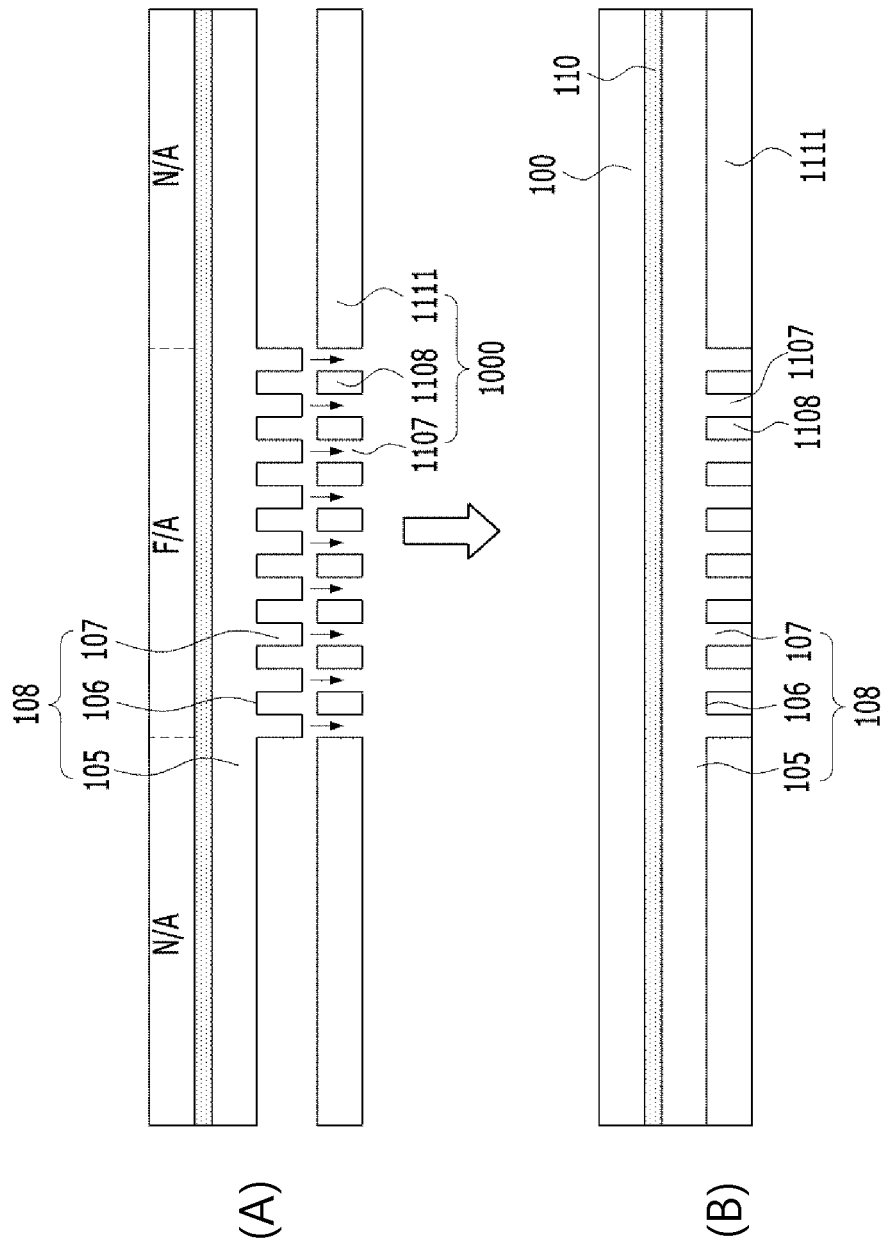
FIG. 4 is a schematic view of the foldable display device according to the present invention, which shows a cross-section of the foldable display device and a method of manufacturing the foldable display device.

FIG. 4 is a schematic view illustrating a cross-section of the foldable display device according to the present invention, and a method of manufacturing the foldable display device. Referring to (A) of FIG. 4, the display panel 100 is attached to the support 108 via an adhesive layer 110. The back cover 1000 is disposed on the rear surface of the support 108. The support 108 includes the protruding patterns 107. The protruding patterns 107 have the same shapes as the shapes of the open patterns 1107. Specifically, the areas of the back cover 1000, which correspond to the protruding patterns 107, are provided with the hole-shaped open patterns 1107. Consequently, the protruding patterns 107 are fitted into the open patterns 1107 in the back cover 1000. In this situation, since the protruding patterns 107 and the open patterns 1107 are configured to have the same height, there is no height difference between the protruding patterns 107 and the open patterns 1107. Accordingly, the rear surface of the back cover folding part 1110, at which the protruding patterns 107 and the folding patterns 1108 are present, appears flat, as illustrated in (B) of FIG. 4.

The soft part 106 can be integrally formed with the protruding patterns 107. In particular, since the non-folding parts N/A are firmly supported by the back cover 1000, the hard part 105 can be integrally formed with the soft part 106 and the protruding patterns 107 using the same material as the soft part 106 and the protruding patterns 107. In this embodiment, the support 108 is made of silicon resin, as mentioned above. The silicon resin can be composed to include a thermal curing agent or a UV curing agent. Accordingly, for the coupling of the support 108 to the back cover 1000, silicon resin, which is a constituent material of the support 108, is applied, the back cover 1000 is pressed onto the silicon resin of the support 108, and the silicon resin of the support is cured using UV radiation or heat, thereby creating the support 108. At this time, since the silicon resin is a viscous fluid, the silicon resin freely enters the open patterns 1107 of the back cover 1000, and is then cured therein, thereby providing the support 108 with the protruding patterns 107.

As mentioned above, since the back cover 1000 has high rigidity, there is no problem even when the area of the support that corresponds to the non-folding part N/A of the display panel 100 is provided with the soft part 106, in place of the hard part 105.

Figure 5:
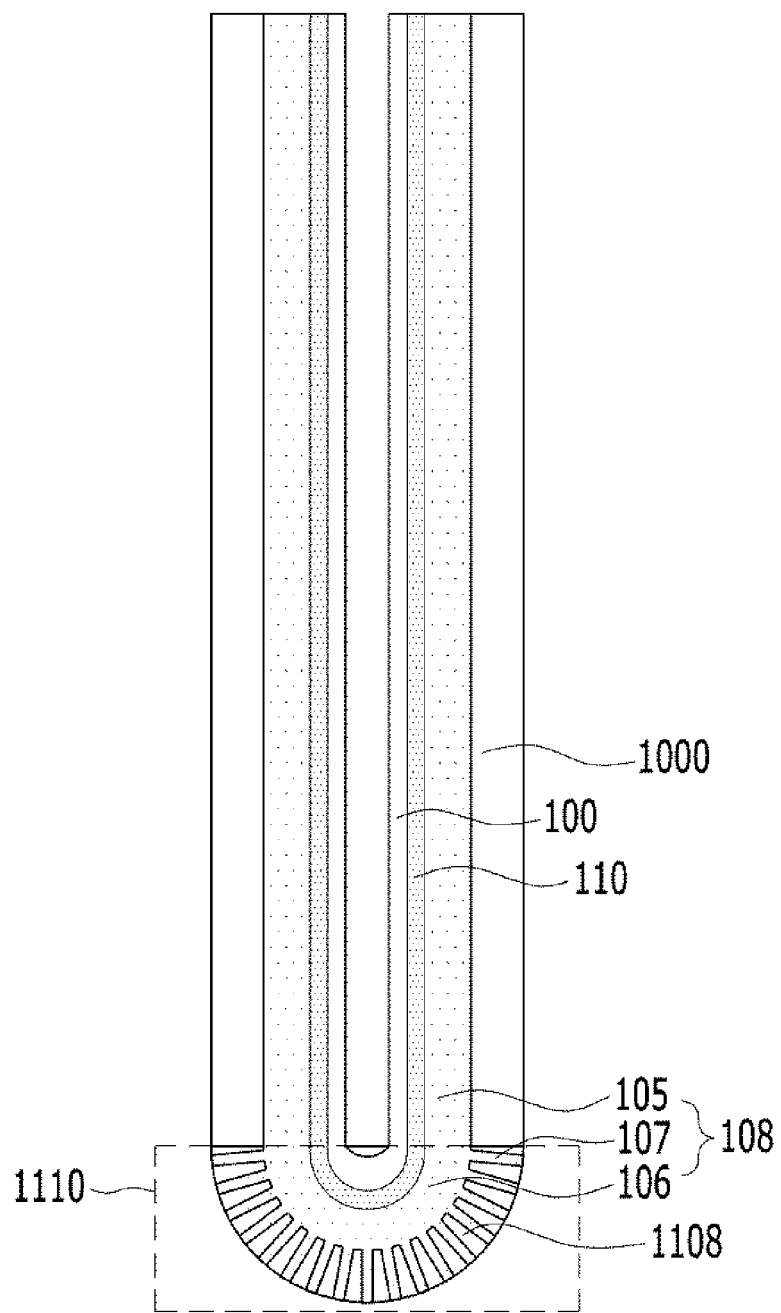
FIG. 5 is a schematic view illustrating the foldable display device according to the present invention in a folded state.

FIG. 5 is a schematic view illustrating the foldable display device according to the present invention in a folded state.

Referring to FIG. 5, the foldable display device according to the present invention includes the fine-sized folding patterns 1108. When the back cover 1000 and the display panel 100 are folded, the stress applied to the individual folding patterns 1108 is reduced because the folding patterns 1108 are at least partially separated from each other. In addition, since the back cover 1000 according to the present invention is made of metal or the like, the back cover 1000 has high rigidity and foldability.

As is apparent from the above description, the foldable display device according to the present invention includes the support 108 equipped with the protruding patterns 107, which are fitted into the open patterns 1107 defined between the folding patterns 1108 of the back cover 1000. Here, since the support 108 equipped with the protruding patterns 107 includes the soft part at the area thereof corresponding to the folding part F/A, the support 108 has high foldability. Furthermore, since the protruding patterns 107 having high foldability are disposed between the folding patterns 1108 to support them, it is possible to prevent deformation of the folding patterns 1108 without affecting the foldability.

In the situation where a back cover 1000 is not provided with the protruding patterns 107 and thus the open patterns 1107 between the folding patterns 1108 are empty, deformation, such as shifting or inclination of the folding patterns 1108, may be caused when the folding patterns 1108 become spaced apart from each other. In this situation, the flatness of the folding part F/A of the display panel 100, which is coupled to the folding patterns 1108 of the back cover 1000, is reduced, and thus unevenness is generated at the folding part F/A, thereby causing a phenomenon whereby the display screen is distorted. In contrast, since the protruding patterns 107 according to the present invention are fitted into the open patterns 1107, the folding patterns 1108 are supported by the protruding patterns 107, thereby preventing deformation of the folding patterns 1108. Consequently, the flatness of the folding part F/A of the display panel 100 is improved, and distortion of the display screen is prevented.

Although the embodiments of the present invention have been described above in detail with reference to the accompanying drawings, it will be apparent to those skilled in the art that the present invention described above is not limited to the embodiments described above, and various substitutions, modifications, and alterations may be devised within the spirit and scope of the present invention. Accordingly, various embodiments disclosed in the present invention are not intended to limit the technical spirit of the present invention, and the scope of the technical spirit of the present invention is not limited by the embodiments. Accordingly, the disclosed embodiments are provided for the purpose of description and are not intended to limit the technical scope of the disclosure, and the technical scope of the disclosure is not limited by the embodiments. The range of the disclosure should be interpreted based on the following claims, and all technical ideas that fall within the range equivalent to the claims should be understood as belonging to the scope of the disclosure.

What is claimed is:

1. A foldable display device comprising:
a display panel including a first non-folding part, a second non-folding part and a folding part disposed between the first and second non-folding parts;
a support disposed on a rear surface of the display panel; and
a back cover disposed on a rear surface of the support,
wherein the back cover includes open patterns exposing the support, and folding patterns disposed on an area of the rear surface of the support corresponding to the folding part,
wherein the support includes protruding patterns disposed on an area of the support corresponding to the open patterns of the back cover,
wherein the protruding patterns are fitted into the open patterns, and
wherein the support includes a soft part disposed on a rear surface of the folding part, and the protruding patterns protrude from the soft part of the folding part toward the back cover.

2. The foldable display device according to claim 1, wherein each of the open patterns and each of the folding patterns has a bar shape extending in a same direction as a folding axis of the display panel.

3. The foldable display device according to claim 2, wherein each of the open patterns and each of the folding patterns has a length equal to a width of the display panel in a direction along the folding axis of the display panel.

4. The foldable display device according to claim 3, wherein the folding patterns are spaced apart from each other.

5. The foldable display device according to claim 2, wherein the folding patterns include a connecting pattern connecting adjacent folding patterns to each other.

6. The foldable display device according to claim 2, wherein the open patterns include a connecting open pattern connecting adjacent open patterns to each other.

7. The foldable display device according to claim 1, wherein the open patterns include a plurality of diamond shapes.

8. The foldable display device according to claim 1, wherein the open patterns include at least one of a circular shaped open pattern and a rectangular shaped open pattern.

9. The foldable display device according to claim 1, wherein the folding patterns have a net shape.

10. The foldable display device according to claim 1, wherein the protruding patterns are made of a silicon resin.

11. The foldable display device according to claim 1, wherein each of the open patterns and each of the protruding patterns have a same height.

12. The foldable display device according to claim 1, wherein the soft part is disposed over an entirety of the rear surface of the display panel.

13. The foldable display device according to claim 1, wherein the support further includes a hard part disposed on a rear surface of the non-folding part, and the hard part and the soft part have a same thickness, and
wherein the hard part is more rigid than the soft part.

14. The foldable display device according to claim 1, wherein the open patterns are openings that pierce through opposite sides of the back cover, and
wherein the support is disposed between the display panel and the back cover.

15. A foldable display device comprising:
a display panel including a first non-folding part, a second non-folding part and a folding part disposed between the first and second non-folding parts;
a back cover including a first plate, a second plate and a back cover folding part disposed between the first and second plates and corresponding to the folding part of the display panel; and
a support disposed between the display panel and the back cover, and including flexible protruding patterns extending into the back cover,
wherein the back cover includes empty open patterns and rigid folding patterns, and the flexible protruding patterns of the support are fitted into the corresponding empty open patterns between the rigid folding patterns of the back cover,
wherein each of the protruding patterns has a first height, and each of the folding patterns has a second height equal to the first height of each of the protruding patterns, and
wherein the flexible protruding patterns are more flexible than the rigid folding patterns.

16. The foldable display device of claim 15, wherein the flexible protruding patterns are interleaved with the rigid folding patterns and together the flexible protruding patterns and the rigid folding patterns form a flush rear surface of the back cover.

17. The foldable display device of claim 15, wherein the support and the flexible protruding patterns are a same flexible material.

18. The foldable display device of claim 15, wherein the support extends across an entire rear surface of the display panel and across an entire inner surface of the back cover.

19. The foldable display device of claim 15, wherein each of the empty open patterns has a width of 0.1 mm to 0.4 mm, each of rigid folding patterns has a width of 0.1 mm to 0.4 mm, and each of the protruding patterns have a height of 0.01-1 mm.

20. A foldable display device comprising:
a display panel including a first non-folding part, a second non-folding part and a folding part on a folding axis of the display panel and between the first and second non-folding parts;
a back cover including a first non-folding portion, a second non-folding portion and a back cover folding part disposed between the first and second non-folding portions and corresponding to the folding part of the display panel; and
a support disposed between the display panel and the back cover, and including flexible protruding patterns extending into the back cover,
wherein the back cover includes empty open patterns and rigid folding patterns both disposed parallel to the folding axis of the display panel, and the flexible protruding patterns of the support are fitted into the corresponding empty open patterns between the rigid folding patterns of the back cover,
wherein each of the protruding patterns has a first height, and each of the folding patterns has a second height equal to the first height of each of the protruding patterns,
wherein the flexible protruding patterns are more flexible than the rigid folding patterns, and
wherein each of the empty open patterns has a width of 0.1 mm to 0.4 mm, and each of rigid folding patterns has a width of 0.1 mm to 0.4 mm.

\* \* \* \* \*